United States Patent
Sun et al.

(10) Patent No.: US 10,588,217 B2
(45) Date of Patent: Mar. 10, 2020

(54) PREPARATION METHOD OF FLEXIBLE TRANSPARENT CIRCUIT

(71) Applicant: Dalian University, Dalian, Liaoning (CN)

(72) Inventors: Jing Sun, Liaoning (CN); Mingfei Lang, Liaoning (CN)

(73) Assignee: DALIAN UNIVERSITY, Dalian (CN)

( * ) Notice: Subject to any disclaimer, the term of this patent is extended or adjusted under 35 U.S.C. 154(b) by 0 days.

(21) Appl. No.: 16/031,088

(22) Filed: Jul. 10, 2018

(65) Prior Publication Data
US 2020/0022256 A1     Jan. 16, 2020

(51) Int. Cl.
| | |
|---|---|
| H05K 3/00 | (2006.01) |
| H05K 1/02 | (2006.01) |
| H05K 1/03 | (2006.01) |
| H05K 3/12 | (2006.01) |
| H05K 1/09 | (2006.01) |

(52) U.S. Cl.
CPC ......... *H05K 1/0283* (2013.01); *H05K 1/0393* (2013.01); *H05K 3/0014* (2013.01); *H05K 3/1258* (2013.01); *H05K 1/0326* (2013.01); *H05K 1/0346* (2013.01); *H05K 1/09* (2013.01); *H05K 2201/0108* (2013.01); *H05K 2201/0162* (2013.01); *H05K 2201/0323* (2013.01); *H05K 2203/0108* (2013.01); *H05K 2203/0191* (2013.01)

(58) Field of Classification Search
CPC ... H05K 3/0014; H05K 3/0011; H05K 3/0017
See application file for complete search history.

(56) References Cited

U.S. PATENT DOCUMENTS

| | | | | |
|---|---|---|---|---|
| 2006/0225275 A1* | 10/2006 | Yang | .................... | H05K 3/4614 29/852 |
| 2015/0162309 A1* | 6/2015 | Vincent | ............... | H01L 25/0657 257/777 |
| 2016/0029475 A1* | 1/2016 | Hwang | ................ | H05K 1/0393 174/254 |

FOREIGN PATENT DOCUMENTS

CN       101505575       8/2009

* cited by examiner

*Primary Examiner* — Jeremy C Norris
(74) *Attorney, Agent, or Firm* — Hauptman Ham, LLP

(57) ABSTRACT

A manufacturing method of a flexible transparent circuit includes preparing a circuit template. The method further includes using a flexible transparent polymer material to prepare a cured transparent carrier on the circuit template, wherein the cured transparent carrier has a groove circuit structure. The method includes coating a solution containing a conductive material in a groove of the cured transparent carrier. The method further includes forming a circuit with the high transparency and conductivity after the solvent is volatilized. The circuit are designed and manufactured according to the requirements, and the precision thereof is able to achieve the micron or nanometer level. The formed circuit is light. The circuit can be stretched, bended or twisted many times. The circuit has a good biological compatibility. The circuit manufactured by such method is expected to be applied in various fields such as smart contact lens, flexible transparent electron devices, electronic skins.

20 Claims, 4 Drawing Sheets

PREPARATION METHOD OF FLEXIBLE TRANSPARENT CIRCUIT

FIELD OF THE INVENTION

The present invention relates to the field of circuit and circuit board, and more particularly to a manufacturing method of a flexible transparent circuit.

BACKGROUND OF THE INVENTION

With the rapid development in wearable medical equipment industry and transparent electronic equipment industry, more and more researchers pay attention to the flexible transparent circuit. The breakthrough of the material and method for flexible transparent circuit is of great significance to the aforementioned two industries. At present, there is a limited number of reports relating to the flexible transparent circuit, among which the most common material is the graphene. However, the transparent circuit made of the graphene has the following disadvantages:

1. The graphene films, especially the graphene films having a large area, tend to form wrinkles;
2. The precise control of the quality for the graphene films is difficult to proceed, and the films get broken easily;
3. The mass production of the graphene films is hard to carry out;
4. The best graphene film has a sheet resistance of around 100 Ohms, and the transparency thereof is only 90%.

Recently, researchers employed the surface patterning method of using nanoparticles to manufacture the flexible transparent circuit. However, such method has a complicated process and an inaccurate circuit control. And the circuit cannot have a good conductivity, transparency and flexibility at the same time, therefore limiting application of the method.

Chinese patent CN101505575A discloses a manufacturing method of a flexible circuit based on PDMS biological compatibility. Although the PDMS substrate disclosed in the patent is transparent, the circuit part of the liquid metal tin-indium-gallium alloy is opaque. Namely, the manufactured circuit comprises a transparent substrate and an opaque conductive material. Meanwhile, the conductive part in the flexible circuit is the liquid metal, and the area where the liquid metal contacts with the conductive devices or the wires is prone to liquid leakage. The insertion or the withdrawal cannot be performed according to actual requirements, otherwise the circuit may fail. As the conductive part of the flexible circuit is the liquid metal, another one sheet must cover the substrate having a channel so that the sheet and the substrate can form a complete and closed channel which is capable of maintaining the conductive metal liquid in the channel. Therefore the requirement for channel sealing is quite high. With a poor sealing, the liquid metal tends to leakage resulting in a short circuit.

SUMMARY OF THE INVENTION

In order to make up the blank in the prior art, the present invention discloses a manufacturing method of a flexible transparent material. Both the substrate and the circuit conductive part of the flexible transparent circuit manufactured by such method are transparent, which realizes a true transparent circuit. Such transparent circuit has not only a good conductivity but also excellent properties of stretch, bending and twisting. The transparent circuit is of great significance to the development of the flexible transparent electronic devices and the wearable medical devices.

To achieve the aforementioned purpose, the present invention employs the following technical scheme. A manufacturing method of a flexible transparent circuit comprises following steps:

S1. preparing a circuit template;
S2. using a flexible transparent polymer material to prepare a cured transparent carrier on the circuit template, wherein the cured transparent carrier has a groove circuit structure;
S3. coating a solution containing a conductive material in a groove of the cured transparent carrier, forming the flexible transparent circuit with the conductive material that exists in the groove circuit structure after volatilization of a solvent, and then removing the conductive material outside the groove to form the transparent flexible circuit.

The shape and size of the circuit template prepared in step S1 and the length, width, height of the circuit can be freely designed according to actual requirements. The circuit pattern may be designed according to actual requirements and is not restricted to linear type, i.e., the circuit may be in a shape of a curved line, a polygonal line, a square wave, a wave, a circle, an ellipse, a ring, or any combination thereof The length, width and height of each line in the circuit can be changed as needed. The circuit template is not limited to be planar, but can also be curved or 3D.

Preferably, in step S1, a circuit with a protruding surface structure is prepared on a hard and smooth material by any method of photolithography, processing, thermoforming, elecropolishing or 3D printing to form the circuit template. The protruding surface structure in the present invention means that the height of the circuit pattern is higher relative to the surface of the whole material. In other words, the circuit on the circuit template is protruding. The hard and smooth material in the present invention may be any one of a silicon wafer, a metal or a polymer material. The polymer material can be the thermal sensitive polymer material such as phenolic resin or a hard polymer material such as polytetrafluoroethylene.

The step S2 of the present invention can be implemented with two methods.

The first method is: pouring a monomer mixture constituting the flexible transparent polymer material or a mixed liquor of reactants on a surface of the circuit template; and after a curing reaction of a transparent polymer material, peeling a cured transparent material from the circuit template to form the cured transparent carrier having the groove circuit structure.

The monomer mixture of the flexible transparent polymer material such as the liquid A and liquid B of the polydimethylsiloxane, or the mixed liquor of reactants such as the mixed liquor for preparing the silicone hydrogel or the hydrogel are poured on the template that has the circuit to perform the curing reaction. The flexible transparent polymer material is initially in a liquid phase and eventually changes to a solid phase through the reaction. And the solid shape can be maintained. Besides the listed materials, the aforementioned flexible transparent polymer material can also comprise a polyvinyl alcohol hydrogel, a chitosan hydrogel and the like. The circuit pattern protruding from the circuit template causes the cured flexible transparent polymer to have a grooved circuit pattern. Some polymer materials such as the polyvinyl alcohol hydrogel need to remove the air bubbles before curing. In the end, the transparent polymer material is present in the form of a transparent solid.

The second method is: using 3D printing technology. The flexible transparent polymer materials such as PDMS, the silicone hydrogel, the chitosan hydrogel, etc. are used directly for 3D printing to form a cured transparent carrier having the groove circuit structure.

In step S3, first of all, a conductive material is dispersed in a volatilizable solvent. The solution containing the conductive material is coated on a groove of the cured transparent carrier. And then the conductive material coated outside the groove is cleaned. After volatilization of the solvent, the conductive material presenting in a solid state remains in the groove circuit structure to form the flexible transparent circuit. The conductive material comprises at least one of a silver nanowire, a copper nanowire, a gold nanowire, a conductive hydrogel, a carbon nanotube, a graphene, a nano-gold chain or a nanoparticle. The conductive material can be coated on the groove of the cured transparent carrier through any method of direct coating, spraying or spin coating.

After the circuit is formed, in order to protect the conductive material in the groove and increase the stability and oxidation resistance of the conductive material on the transparent substrate, the manufacturing method may add step S4: spreading the flexible transparent polymer material on the surface of the flexible transparent circuit. The circuit is sandwiched between two transparent materials to protect the circuit and avoid oxidation. The conductive materials in the groove connect with each other. The conductive materials distribute in the groove evenly, allowing the circuit board have a good conductivity.

The aforementioned method may further comprise step S5: conducting the flexible transparent circuit to the external world. The conduction is implemented by connecting the conductive material to an electron device, an external power supply or a conductive wire. The conduction of the flexible circuit with the electron device or the power supply is achieved by connecting the conductive part or wire of the electron device with the conductive material in the groove of the flexible transparent circuit to form a loop. The electron device or wire can be pre-embedded or inserted inside the flexible transparent conductive material.

The other purpose of the present invention is to claim protection of a flexible and transparent multilayer circuit. Two flexible transparent circuits are manufactured according to the methods disclosed in the present invention. The two flexible transparent circuits are stacked together and penetrated by the conductive material to form the flexible and transparent multilayer circuit.

Compared with the prior art, the present invention has following beneficial effects:

The flexible circuit manufactured in the present invention has a high transparency. Not only the flexible polymer material carrier of the circuit is transparent, but also the conductive material is transparent. The conductivity is excellent. The conductive material forming the circuit is dry so that there is no need to close the bottom groove. The electron device and the wire can be inserted or extracted as needed. And the conductive material would not lose causing the circuit to fail. The flexible transparent carrier disclosed in the present invention is light and has the biological compatibility. The transparent circuit formed on the flexible transparent carrier can be easily attached on the body surface or implanted within the body of human or animals. The circuit would not be affected to stop by the action of the animals or human. With the flexibility of the flexible substrate, the circuit has good properties of stretch, twisting and bending. The circuit is able to maintain excellent properties of bending resistance, stretch and twisting even the circuit is folded 180 degree forwardly and reversely many times with the insertion of the conductive devices and wires. The circuit are designed and manufactured according to the requirements, and the precision thereof is up to the micron or nanometer level.

The preparation process of the present invention is simple, reproducible. The formed circuit is light. The circuit manufactured by such method is expected to be applied in various fields such as smart contact lens, flexible transparent electron devices, electronic skins and so forth.

DESCRIPTION OF THE DRAWINGS

The present invention has four drawings, in which.

the flowchart of the method of manufacturing the flexible transparent circuit that has a microstructure by using a silicon wafer template with a photoresist pattern as the circuit template and using a silver nanowire as the conductive material.

Figure 1:
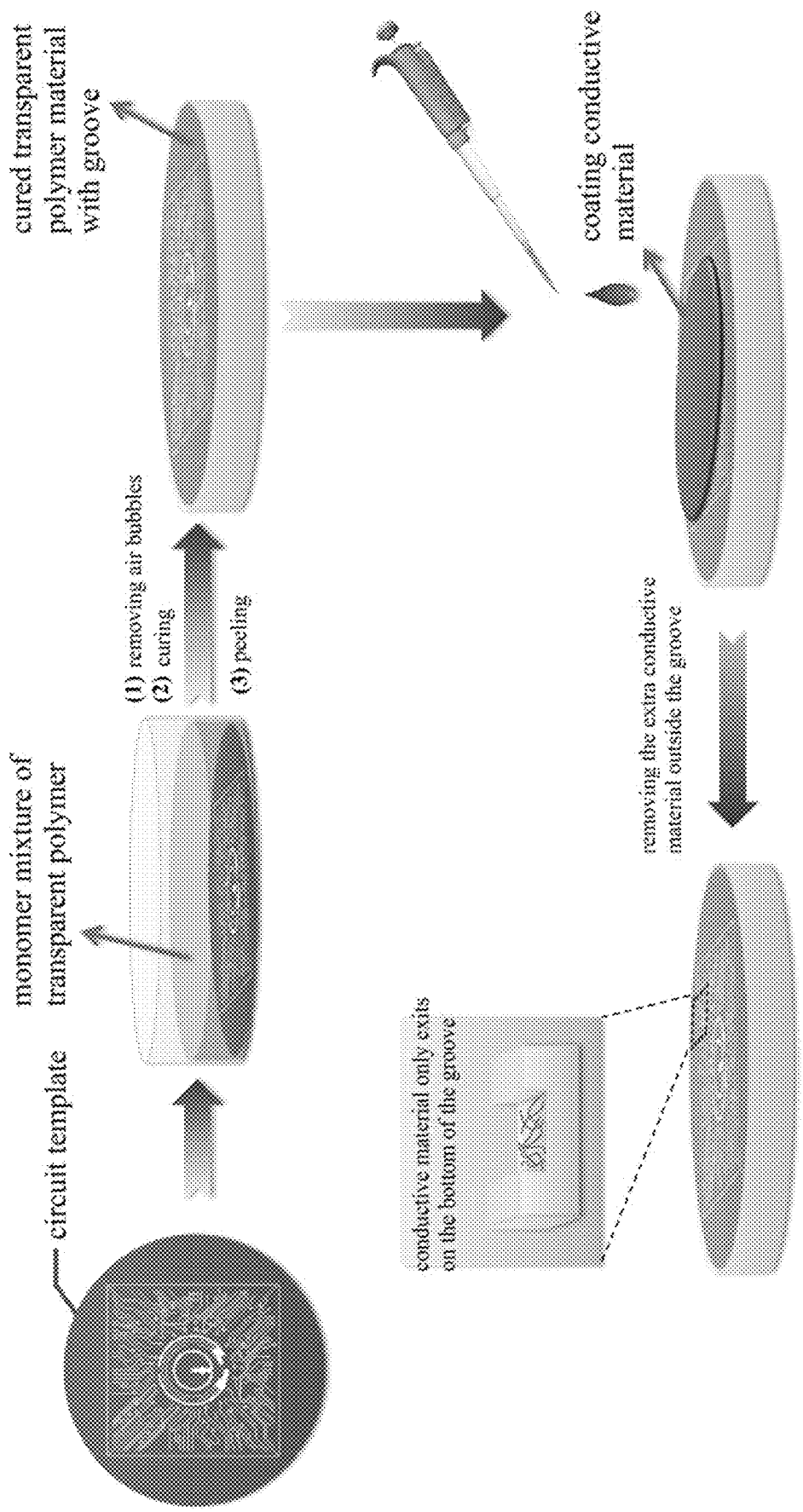
FIG. 1 is the flowchart of manufacturing the flexible transparent circuit.
Figure 2:
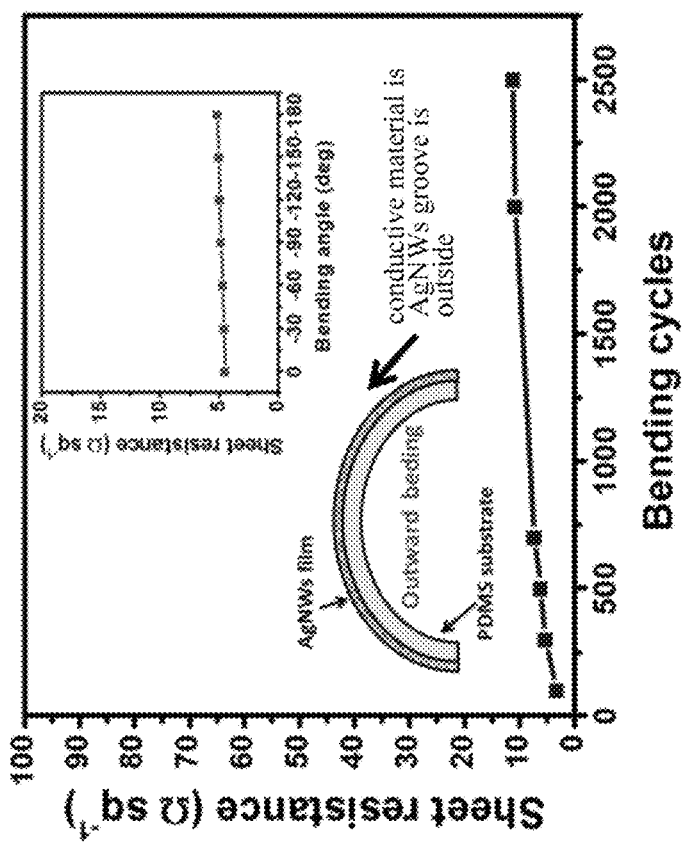
Figure 2:
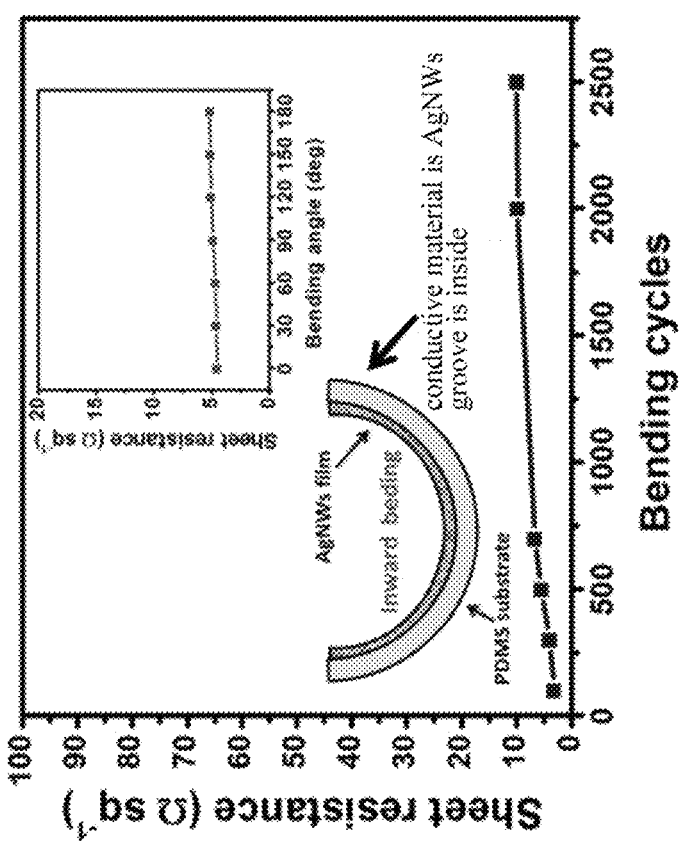

FIG. 2 is the resistance variation curve of the conductive material manufactured by the method of the present invention after being folded forwardly and reversely many times.

Figure 3:
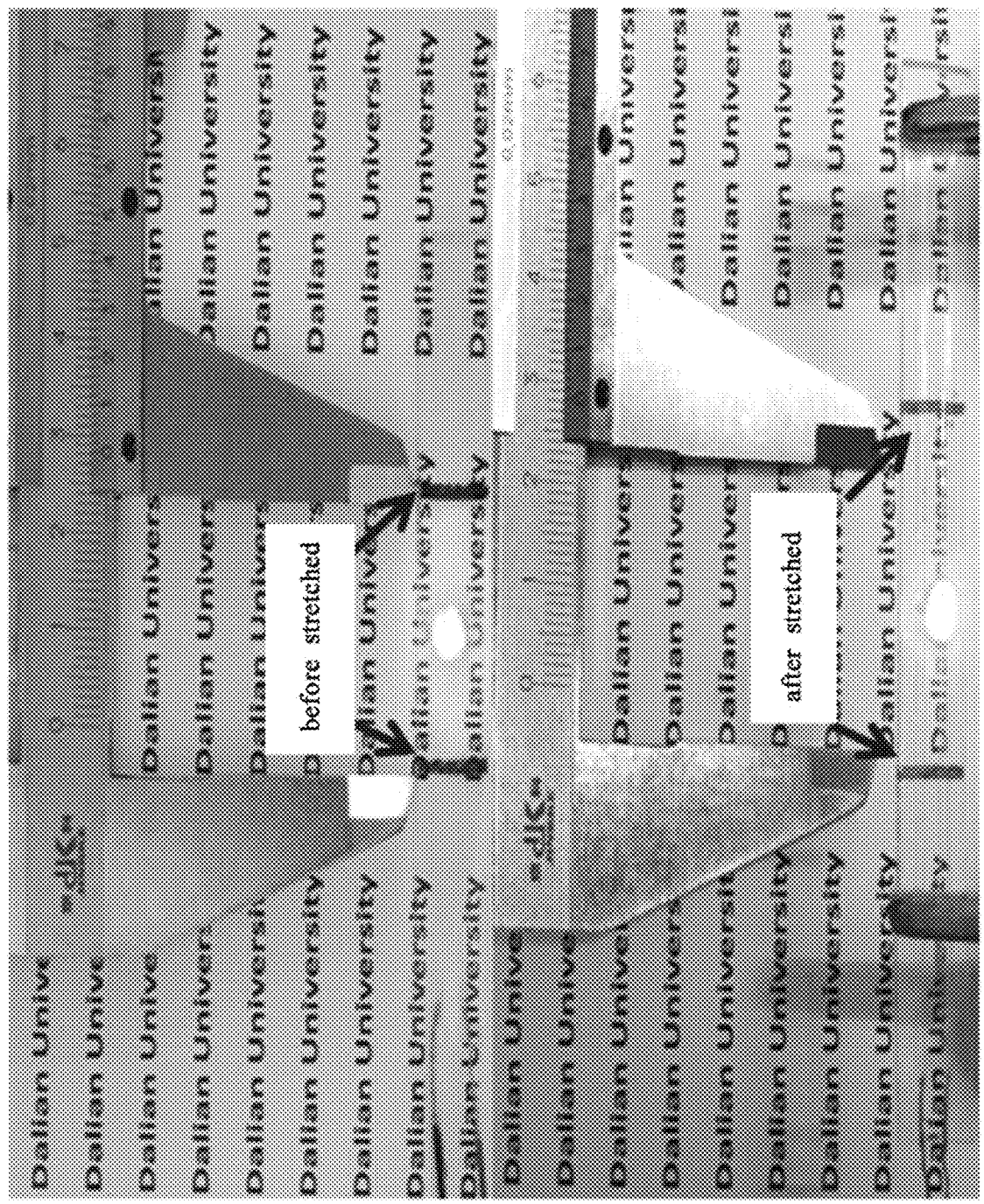

FIG. 3 is the drawing of the stretch of the flexible transparent circuit manufactured by the present invention in a condition that the LED light is switched on.

Figure 4:
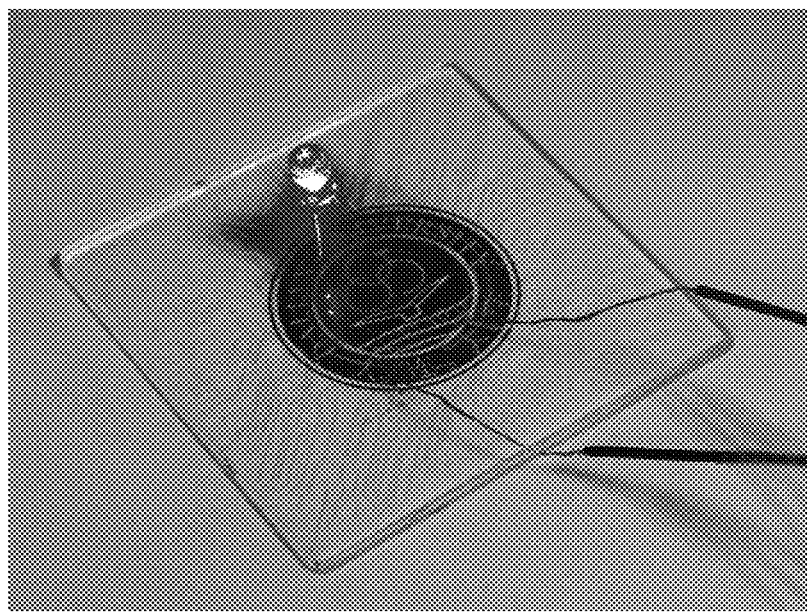

FIG. 4 is the photo of the flexible transparent circuit manufactured by the present invention in a condition that the LED light is switched on.

DETAILED DESCRIPTION OF THE PREFERRED EMBODIMENTS

The technical schemes of the present invention would now be further described with reference to the specific embodiments, but the present invention is not limited to the content disclosed in the embodiments in any form. Without specific illustration, the experimental methods described in the embodiments are conventional methods. Without specific illustration, the chemical reagents and materials are commercially available. The following embodiments that is not intended to limit may allow one skilled in the art to more fully understand the present invention, but do not limit the present invention in any form. The ethanol used in the present invention is of GR purity grade.

Embodiment 1

The silver nanowire (AgNWs) ethanol solution used in the present invention has the following specifications: a diameter of 30 nm, a length of 100 to 200 um, a concentration of 20 mg/ml and a solvent of the anhydrous ethanol.

1. Preparing the Circuit Template

With the photolithographic technology, a circuit having a protruding surface structure is patterned on a silicon wafer of 4 inch by using the SU-2050 photoresist to form the circuit template.

2. Preparing the PDMS Transparent Carrier

The liquid A and liquid B of the Polydimethylsiloxane (Polydimethylsiloxane, PDMS) are mixed uniformly in a ratio of 10:1. Then the mixture is poured on the template prepared with the silicon wafer that is patterned a circuit pattern. The air bubbles in the PDMS are removed in the vacuum dryer. The drying time is around 1 hour. Later, the template is placed in an oven at 80° C. to be cured and heated for 1 hour to eventually form the cured transparent PDMS carrier having the groove circuit structure.

3. Preparing the Flexible Transparent Circuit

A. AgNWs ethanol solution of 0.3 mg/ml is prepared.

B. 40 uL AgNWs solution is drawn and added dropwise on the surface of the cured transparent PDMS carrier. And the spin coating is performed at an acceleration of 300 rpm and a speed of 3000 rpm for 40 s.

C. Step B is repeated two more times. The AgNWs ethanol solution is coated in the groove of the circuit board. After the ethanol solution is completely volatilized, the extra AgNWs is removed by using the 3M adhesive tape to form the flexible transparent circuit board. The surface resistance of the circuit board is measured with the handheld four point probe resistance meter. The transmittance of the circuit board is measured with the ultraviolet spectrophotometer at a wavelength of 550 nm. The measurements prove that the transparent flexible circuit has a resistance of 3.21 Ω and a transmittance of 92.48%.

Embodiment 2

The copper nanowire (CuNWs) ethanol solution used in the present invention has the following specifications: a diameter of 20 nm, a length of 80 um, a concentration of 20 mg/ml and a solvent of the anhydrous ethanol.

1. Preparing the Circuit Template

With the photolithographic technology, a desired circuit is patterned on a silicon wafer of 4 inch by using the SU-2050 photoresist to form the template.

2. Preparing the PDMS Transparent Carrier

The liquid A and liquid B of the Polydimethylsiloxane (Polydimethylsiloxane, PDMS) are mixed uniformly in a ratio of 10:1. Then the mixture is poured on the template prepared with the silicon wafer that is patterned a circuit pattern. The air bubbles in the PDMS are removed in the vacuum dryer. The drying time is around 1hour. Later, the template is placed in an oven at 80° C. to be cured and heated for 1 hour to eventually form the cured transparent PDMS carrier having the groove circuit structure.

3. Preparing the Flexible Transparent Circuit

A. CuNWs ethanol solution of 0.4 mg/ml is prepared.

B. 60 uL CuNWs solution is drawn and added dropwise on the surface of the PDMS transparent carrier. And the spin coating is performed at an acceleration of 300 rpm and a speed of 3000 rpm for 40 s.

C. Step B is repeated two more times. After the ethanol solution is completely volatilized, the extra CuNWs is removed by using the 3M adhesive tape to form the transparent flexible circuit board. The surface resistance of the circuit board is measured with the handheld four point probe resistance meter. The transmittance of the circuit board is measured with the ultraviolet spectrophotometer at a wavelength of 550 nm. The measurements prove that the transparent flexible circuit has a resistance of 5.62 Ω and a transmittance of 93.17%.

Embodiment 3

The gold nanowire (AuNWs) ethanol solution used in the present invention has the following specifications: a diameter of 3 nm, a length of 50 um, a concentration of 20 mg/ml and a solvent of the anhydrous ethanol.

1. Preparing the Circuit Template

With the photolithographic technology, a desired circuit is patterned on a silicon wafer of 4 inch by using the SU-2050 photoresist to form the template.

2. Preparing the PDMS Transparent Carrier

The liquid A and liquid B of the Polydimethylsiloxane (Polydimethylsiloxane, PDMS) are mixed uniformly in a ratio of 10:1. Then the mixture is poured on the mould prepared with the silicon wafer that is patterned a circuit pattern. The air bubbles in the PDMS are removed in the vacuum dryer. The drying time is around 1 hour. Later, the template is placed in an oven at 80° C. to be cured and heated for 1 hour to eventually form the cured transparent PDMS carrier having the groove circuit structure.

3. Preparing the Flexible Transparent Circuit

A. AuNWs ethanol solution of 0.5 mg/ml is prepared.

B. 30 uL AuNWs solution is drawn and added dropwise in the groove of the transparent silicon hydrogel chip. After volatilization of the ethanol solution, the coating step is repeated two more times.

C. After the ethanol solution is completely volatilized. The extra AuNWs is removed by using the 3M adhesive tape to form the transparent flexible circuit board. The surface resistance of the circuit board is measured with the handheld four point probe resistance meter. The transmittance of the circuit board is measured with the ultraviolet spectrophotometer at a wavelength of 550 nm. The measurements prove that the transparent flexible circuit has a resistance of 2.38 Ω and a transmittance of 95.02%.

Embodiment 4

The gold nanowire (AuNWs) ethanol solution used in the present invention has the following specifications: a diameter of 3 nm, a length of 50 um, a concentration of 20 mg/ml and a solvent of the anhydrous ethanol.

1. Preparing the Circuit Template

With the aluminium alloy processing technology, a circuit template of a desired circuit is grinded on the aluminium alloy, wherein the circuit template has a protruding surface structure.

2. Preparing the Silicon Hydrogel Flexible Transparent Carrier

The azodiisobutyronitrile (in amount of 0.2 wt % of the total dose) is used as the initiator and the N,N'-Methylenebisacrylamide (in amount of 1.0 wt % of the total dose) is used as the crosslinking agent. The initiator and crosslinking agent are completely dissolved in the mixed solution comprises 2-Hydroxyethyl methacrylate, N-Vinyl-2-pyrrolidone and 3-Methacryloxypropyltrimethoxysilane in a mass ratio of 8:1:1. The aforementioned substances are mixed uniformly by magnetically stirring for 30 minutes and then poured on the aluminium alloy template. Later the template is placed in an oven for 2 hours to be cured. After curing, the substances are demolded from the template to form the silicon hydrogel flexible transparent carrier having the circuit groove.

3. Preparing the Flexible Transparent Circuit

A. Gold nanowire ethanol solution of 0.5 mg/ml is prepared.

B. 30 uL gold nanowire solution is drawn and added dropwise in the groove of the transparent silicon hydrogel chip. After volatilization of the ethanol solution, the coating step is repeated two more times.

C. After the ethanol solution is completely volatilized. The gold nanowire outside the channel is removed by using the 3M adhesive tape to form the transparent flexible circuit board. The surface resistance of the circuit board is measured with the handheld four point probe resistance meter. The transmittance of the circuit board is measured with the ultraviolet spectrophotometer at a wavelength of 550 nm.

The measurements prove that the transparent flexible circuit has a resistance of 4.52 Ω and a transmittance of 94.36%.

Embodiment 5

The carbon nanotube (CNTs) used in the present invention is a hydroxylated single-walled long nanotube which has the following specifications: a diameter of 1.1 nm, a length of 50 um and a solvent of the anhydrous ethanol.

1. Preparing the Circuit Template

With the grinding technology, a desired circuit is grinded on the polytetrafluoroethylene.

2. Preparing the Polyvinyl Alcohol (PVA) Hydrogel Transparent Carrier 5 grams sample of the PVA having a polymerization degree of 1750±50 are weighted. And the distilled water is used as the reagent to prepare 1 g/mL PVA aqueous solution. The prepared PVA aqueous solution is introduced into a flask, heated to 90° C. by a thermostatic water bath, and stirred to completed dissolution. The bubbles in the solution is removed after standing at 60° C. for 30 minutes. Then the solution is poured on the circuit template made of the polytetrafluoroethylene and freezed quickly in a refrigerator at −20° C. 15 hours later, the solution is taken out and thawed at a room temperature for 6 hours. After thawed, the solution is once again placed in the refrigerator and freezed quickly at −20° C. 15 hours later, the solution is taken out and thawed at a room temperature for 6 hours. The freeze-thaw cycle is repeated 10 times to form harder PVA hydrogel transparent carrier having a groove circuit structure.

3. Preparing the Flexible Transparent Circuit

A. CNTs ethanol solution of 0.3 mg/ml is prepared.

B. 30 uL CNTs solution is drawn and added dropwise in the groove of the polyvinyl alcohol hydrogel transparent carrier. After volatilization of the ethanol solution, the coating step is repeated two more times.

C. After the ethanol solution is completely volatilized. The extra CNTs outside the groove is removed by using the 3M adhesive tape to form the transparent flexible circuit board. The surface resistance of the circuit board is measured with the handheld four point probe resistance meter. The transmittance of the circuit board is measured with the ultraviolet spectrophotometer at a wavelength of 550 nm. The measurements prove that the transparent flexible circuit has a resistance of 24.52 Ω and a transmittance of 80.36%.

Embodiment 6

The gold nanowire ethanol solution used in the present invention has the following specifications: a diameter of 5 nm, a length of 90 um, a concentration of 0.5 mg/ml and a solvent of the anhydrous ethanol.

1. Preparing the Circuit Template

With the thermoforming technology, a circuit having a protruding surface structure is prepared on the phenolic resin.

2. Preparing the Chitosan Hydrogel Transparent Carrier 1.2 grams chitosan is weighted and placed in a clean beaker in which 40 ml 2% acetate solution is introduced. The solution is stirred to dissolve. 16 ml 3% glutaraldehyde is added and stirred. The solution is then placed at 55° C. for 1 hour to form yellow transparent chitosan hydrogel solution, which the latter is poured on the phenolic resin template having a circuit and placed at a room temperature for 48 hours to form yellow transparent chitosan hydrogel carrier.

3. Preparing the Flexible Transparent Circuit

A. Gold nanowire ethanol solution of 1 mg/ml is prepared.

B. 30 uL gold nanowire solution is drawn and added dropwise in the groove of the transparent silicon hydrogel chip. After volatilization of the ethanol solution, the coating step is repeated two more times.

C. After the ethanol solution is completely volatilized. The gold nanowire outside the groove is removed by using the 3M adhesive tape to form the transparent flexible circuit board. The surface resistance of the circuit board is measured with the handheld four point probe resistance meter. The transmittance of the circuit board is measured with the ultraviolet spectrophotometer at a wavelength of 550 nm. The measurements prove that the transparent flexible circuit has a resistance of 7.52 Ω and a transmittance of 93.21%.

Testing the properties of the flexible transparent circuit manufactured in the present invention.

FIG. 2 shows the bending experimental results of the material having a linear circuit, wherein the material uses the PDMS as the transparent polymer material and the silver nanowire as the conductive material. Such circuit is bended 180 degree forwardly and reversely. With the increase of the bending degree, the bended circuit has a generally constant resistance. After the circuit is bended forwardly and reversely 2500 times, the resistance of the bended circuit increases slightly. But such increase is quite small.

FIG. 3 shows the stretch experiment of the linear circuit that uses the PDMS as the transparent polymer material and the silver nanowire as the conductive material. The illumination of the LED light indicates the conduction of the circuit. Compared the situation that the circuit is stretched by nearly 35% with the situation that the circuit is not stretched, the luminance of the LED light keeps unchanged, which means the circuit has a good stretch property.

FIG. 4 shows the complicated circuit that uses PDMS as the transparent flexible material. The LED light is inserted in the center circle circuit whose width is 200 um, which means the method provided in the present invention can manufacture micron size flexible transparent circuit.

What is claimed is:

1. A manufacturing method of a flexible transparent circuit, characterized in that, the manufacturing method comprises following steps:
    S1. preparing a circuit with a protruding surface structure on a hard and smooth material to form a circuit template;
    S2. using a flexible transparent polymer material to prepare a cured transparent carrier on the circuit template by pouring a monomer mixture constituting the flexible transparent polymer material or a mixed liquor of reactants on a surface of the circuit template; and after a curing reaction of a transparent polymer material, peeling a cured transparent material from the circuit template to form the cured transparent carrier having a groove circuit structure; and
    S3. coating a solution containing a conductive material in a groove of the cured transparent carrier, forming the flexible transparent circuit with the conductive material that exists in the groove circuit structure after volatilization of a solvent, and then removing the conductive material outside the groove to form the transparent flexible circuit.

2. The manufacturing method of the flexible transparent circuit according to claim 1, characterized in that, step S2 further comprises 3D printing the flexible transparent polymer material to form the cured transparent carrier having the groove circuit structure.

3. The manufacturing method of the flexible transparent circuit according to claim 1, characterized in that, the manufacturing method further comprises step S4: spreading the flexible transparent polymer material on the surface of the flexible transparent circuit.

4. The manufacturing method of the flexible transparent circuit according to claim 1, characterized in that, the manufacturing method further comprises step S5: conducting the flexible transparent circuit formed in step S4 to external world.

5. The manufacturing method of the flexible transparent circuit according to claim 1, characterized in that, the hard and smooth material in step S1 comprises any one of a silicon wafer, a metal or a polymer material.

6. The manufacturing method of the flexible transparent circuit according to claim 1, characterized in that, in step S2, the flexible transparent polymer material comprises any one of PDMS, a silicone hydrogel or a hydrogel.

7. The manufacturing method of the flexible transparent circuit according to claim 1, characterized in that, the conductive material comprises at least one of a silver nanowire, a copper nanowire, a gold nanowire, a conductive hydrogel, a carbon nanotube, a graphene, a nano-gold chain or a nanoparticle.

8. The flexible and transparent multilayer circuit, characterized in that, at least two flexible transparent circuits are manufactured according to the method claimed in claim 1, and the at least two flexible transparent circuits are stacked together and penetrated by the conductive material to form the flexible and transparent multilayer circuit.

9. Applications of the flexible transparent circuit manufactured according to the method claimed in claim 1 in fields of transparent electronic devices, smart contact lens, electronic skins and the like.

10. A manufacturing method of a flexible transparent circuit, the method comprising:
S1. preparing a circuit with a protruding surface structure on a hard and smooth material to form a circuit template;
S2. using a flexible transparent polymer material to prepare a cured transparent carrier on the circuit template by 3D printing the flexible transparent polymer material to form the cured transparent carrier having a groove circuit structure; and
S3. coating a solution containing a conductive material in a groove of the cured transparent carrier, forming the flexible transparent circuit with the conductive material that exists in the groove circuit structure after volatilization of a solvent, and then removing the conductive material outside the groove to form the transparent flexible circuit.

11. The manufacturing method of the flexible transparent circuit according to claim 10, wherein the manufacturing method further comprises step S4: spreading the flexible transparent polymer material on the surface of the flexible transparent circuit.

12. The manufacturing method of the flexible transparent circuit according to claim 10, wherein the manufacturing method further comprises step S5: conducting the flexible transparent circuit formed in step S4 to external world.

13. The manufacturing method of the flexible transparent circuit according to claim 10, wherein the hard and smooth material in step S1 comprises any one of a silicon wafer, a metal or a polymer material.

14. The manufacturing method of the flexible transparent circuit according to claim 10, wherein, in step S2, the flexible transparent polymer material comprises any one of PDMS, a silicone hydrogel or a hydrogel.

15. The manufacturing method of the flexible transparent circuit according to claim 10, wherein the conductive material comprises at least one of a silver nanowire, a copper nanowire, a gold nanowire, a conductive hydrogel, a carbon nanotube, a graphene, a nano-gold chain or a nanoparticle.

16. The flexible and transparent multilayer circuit, wherein at least two flexible transparent circuits are manufactured according to the method claimed in claim 10, and the at least two flexible transparent circuits are stacked together and penetrated by the conductive material to form the flexible and transparent multilayer circuit.

17. A manufacturing method of a flexible transparent circuit, the method comprising:
pouring a monomer mixture constituting a flexible transparent polymer material or a mixed liquor of reactants on a surface of a circuit template, the circuit template comprising a protrusion extending away from a surface of a substrate;
peeling a cured transparent material from the circuit template to form a cured transparent carrier having a groove circuit structure; and
coating a solution containing a conductive material in a groove of the cured transparent carrier to form the flexible transparent circuit.

18. The manufacturing method of the flexible transparent circuit according to claim 17, further comprising:
spreading the flexible transparent polymer material on the surface of the flexible transparent circuit.

19. The manufacturing method of the flexible transparent circuit according to claim 17, wherein the substrate comprises one or more of silicon, a metal or a polymer.

20. The manufacturing method of the flexible transparent circuit according to claim 17, wherein the flexible transparent polymer material comprises PDMS, a silicone hydrogel or a hydrogel.

* * * * *